United States Patent [19]
Crooks et al.

[11] Patent Number: 5,335,230
[45] Date of Patent: Aug. 2, 1994

[54] APPARATUS AND METHOD FOR AUTOMATIC DIGITIZER FAULT DETECTION

[75] Inventors: John F. Crooks; Robert L. Protheroe, both of Cambridge, Ohio

[73] Assignee: NCR Corporation, Dayton, Ohio

[21] Appl. No.: 744,062

[22] Filed: Aug. 12, 1991

[51] Int. Cl.$^5$ ............... G01R 31/28; G08C 21/00
[52] U.S. Cl. .................... 371/15.1; 178/18; 345/174
[58] Field of Search ................ 371/15.1; 340/712; 178/18

[56] References Cited

U.S. PATENT DOCUMENTS

| | | | |
|---|---|---|---|
| 4,575,580 | 3/1986 | Jandrell | 178/18 |
| 4,623,757 | 11/1986 | Marino | 178/18 |
| 4,710,758 | 12/1987 | Mussler et al. | 340/712 |
| 4,745,242 | 5/1988 | Koizumi et al. | 178/18 |
| 4,819,194 | 4/1989 | Koizumi et al. | 178/18 |
| 4,897,511 | 1/1990 | Itaya et al. | 178/18 |
| 4,980,646 | 12/1990 | Zamel | 324/716 |
| 5,101,081 | 3/1992 | Drumm | 178/18 |
| 5,184,398 | 2/1993 | Moslehi | 29/825 |
| 5,245,139 | 9/1993 | Protheroe et al. | 178/18 |

Primary Examiner—Charles E. Atkinson
Attorney, Agent, or Firm—Paul W. Martin

[57] ABSTRACT

An automatic fault detection apparatus which requires no human intervention. The apparatus includes a source for energizing the digitizer including a constant direct current source and a constant direct voltage source, and a switch for selectively coupling either the constant current source or the constant voltage source to the digitizer. An analog-to-digital converter couples to the digitizer and to the source. A controller couples to the output of the analog-to-digital converter. Switches selectively connect the source and the analog-to-digital converter to the digitizer and include analog switches controlled by the controller. A non-volatile memory couples to the controller. An indicator coupled to the controller provides information about digitizer operability. A plurality of test electrodes within the digitizer couple to the analog-to-digital converter. Finally, a wiring harness connects the analog-to-digital converter and the source to the digitizer. The apparatus couples to operative electrodes within the digitizer. The method of the present invention includes four tests for detecting faults within digitizers.

24 Claims, 10 Drawing Sheets

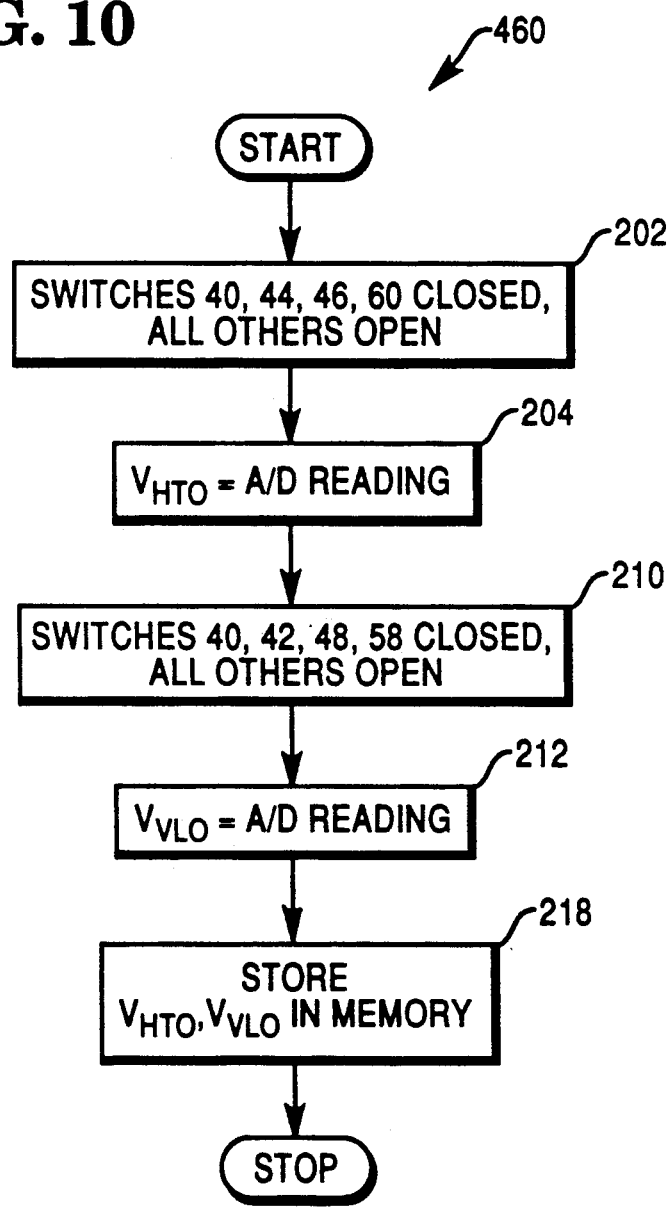

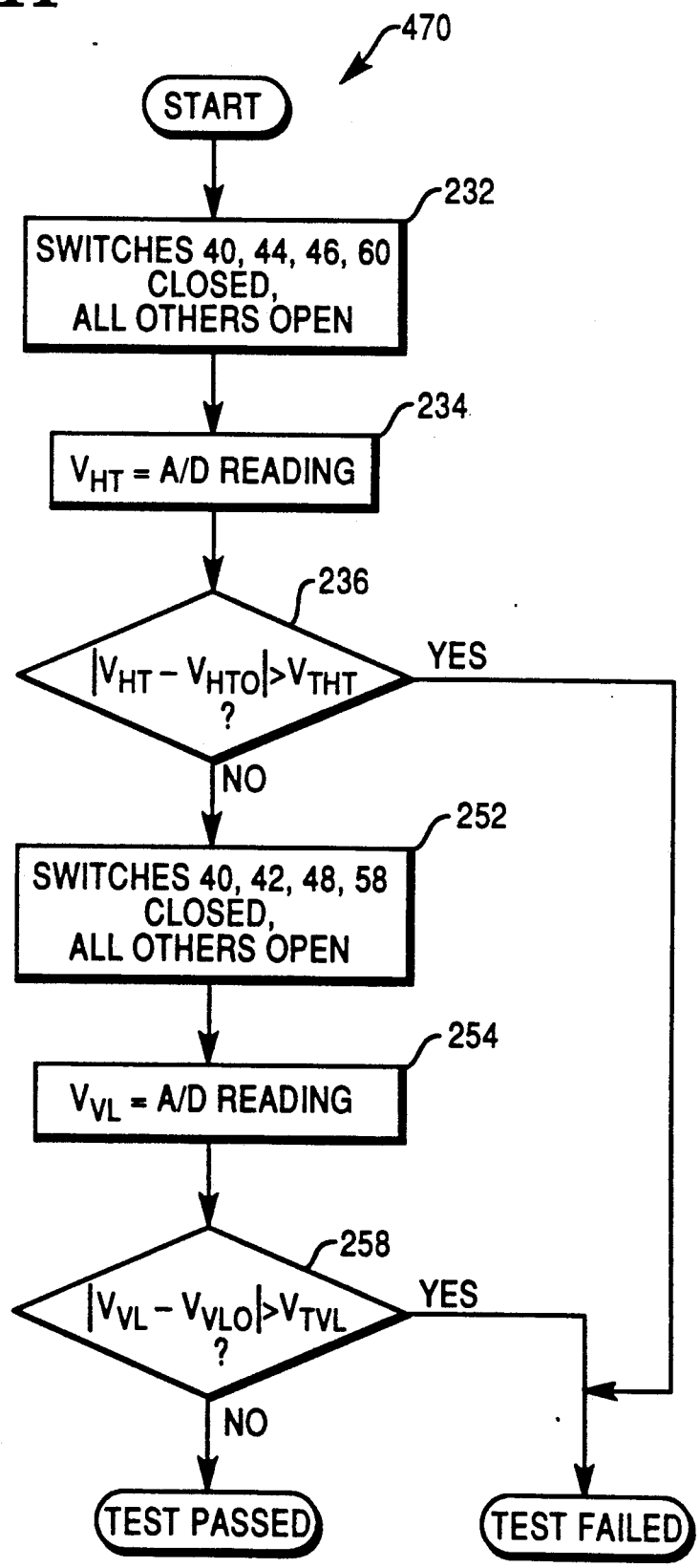

APPARATUS AND METHOD FOR AUTOMATIC DIGITIZER FAULT DETECTION

BACKGROUND OF THE INVENTION

The present invention relates to digitizers and more specifically to an apparatus and method for automatic digitizer fault detection.

Digitizers are used in many different products to capture information. The digitizers in some products are activated by pressure from a stylus, while others are activated by finger contact.

Digitizers are subject to failure in two primary ways. First, the conductive layers may come in contact with each other due to the introduction of foreign material between the conductive layers during manufacture or the presence of conductive materials set free by wear between the conductive layers.

Second, a given conductive layer may become nonuniform. Nonuniformity in a given conductive layer may be caused by wear of the conductive layer or by tears in the conductive layer. Stress fractures in the conductive layer due to sharp bending may occur. Bending is often caused by the use of a sharp stylus or by repeated tracing of the reliefed edge of an electrode. Nonuniformity may also be caused by damage to the electrodes or scratches in the conductive layer.

Both types of failures are virtually undetectable by visual inspection. Therefore, it would be desirable to provide an apparatus and method for automatically testing digitizers.

SUMMARY OF THE INVENTION

In accordance with the teachings of the present invention, an apparatus and method for automatic fault detection in digitizers are provided. The automatic fault detection apparatus includes a source for energizing the digitizer including a constant direct current source and a constant direct voltage source, and a switch for selectively coupling either the constant current source or the constant voltage source to the digitizer. An analog-to-digital converter is coupled to the digitizer and to the source. A controller is coupled to the output of the analog-to-digital converter. Switches selectively connect the sources and the analog-to-digital converter to the digitizer and include analog switches controlled by the controller. A non-volatile memory is coupled to the controller. A plurality of test electrodes within the digitizer are coupled to the analog-to-digital converter. In the preferred embodiment, an indicator, including red and green lights on the device containing the digitizer and a video monitor coupled to the controller, provide information about the operability of the digitizer following the performance of test routines. Finally, a wiring harness connects the analog-to-digital converter and the source to the digitizer. The apparatus couples to operative electrodes within the digitizer.

The method of the present invention includes four tests for detecting faults within digitizers. A first test measures the resistance between the operative electrodes of a conductive layer to detect nonuniformities in the conductive layer. If the difference between a resistance reading and a previously stored resistance reading is greater than a predetermined threshold, then the digitizer fails.

In a second test, a voltage is applied across a conductive layer and voltage readings are taken at a test electrode on the layer. The controller compares the difference between the voltage reading and a previously stored voltage reading to a predetermined threshold voltage reading. If the difference is greater than the threshold, then the digitizer fails.

A third test measures the resistance between a first digitizer electrode on one conductive layer and a second digitizer electrode on another conductive layer. If the resistance is less than a predetermined threshold, then the digitizer passes. If not, then the sum of the deviations of a predetermined number of resistance readings from the first reading is compared by the controller to a predetermined threshold deviation. If the sum is less than the threshold, then the digitizer fails.

A fourth test takes a predetermined number of position readings at a test electrode on one conductive layer, the other conductive layer being biased by a voltage between a first digitizer electrode and a second digitizer electrode on the other conductive layer. The controller compares the sum of the deviations of the position readings from a previously stored reading with a threshold reading. If the sum of the deviations is greater than the threshold, then the digitizer fails.

It is accordingly an object of the present invention to provide an apparatus and method for automatic digitizer fault detection.

It is another object of the present invention to provide an apparatus and method for automatic digitizer fault detection which requires no human intervention.

It is another object of the present invention to provide an apparatus and method for automatic digitizer fault detection which detects short circuits between conductive layers.

It is another object of the present invention to provide an apparatus and method for automatic digitizer fault detection which detects foreign material introduced during manufacture between conductive layers and conductive material set free between conductive layers due to wear.

It is another object of the present invention to provide an apparatus and method for automatic digitizer fault detection which detects nonuniformities in conductive layers.

It is another object of the present invention to provide an apparatus and method for automatic digitizer fault detection which detects wear and tear, stress fractures, electrode damage, and scratches, all within the conductive layers.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

FIG. 10 is a flow diagram of the third part of the method of the present invention as applied to the two-wire digitizer; and FIG. 11 is a flow diagram of a fourth part of the method of the present invention as applied to the two-wire digitizer.

DETAILED DESCRIPTION OF THE PREFERRED EMBODIMENT

Figure 1:
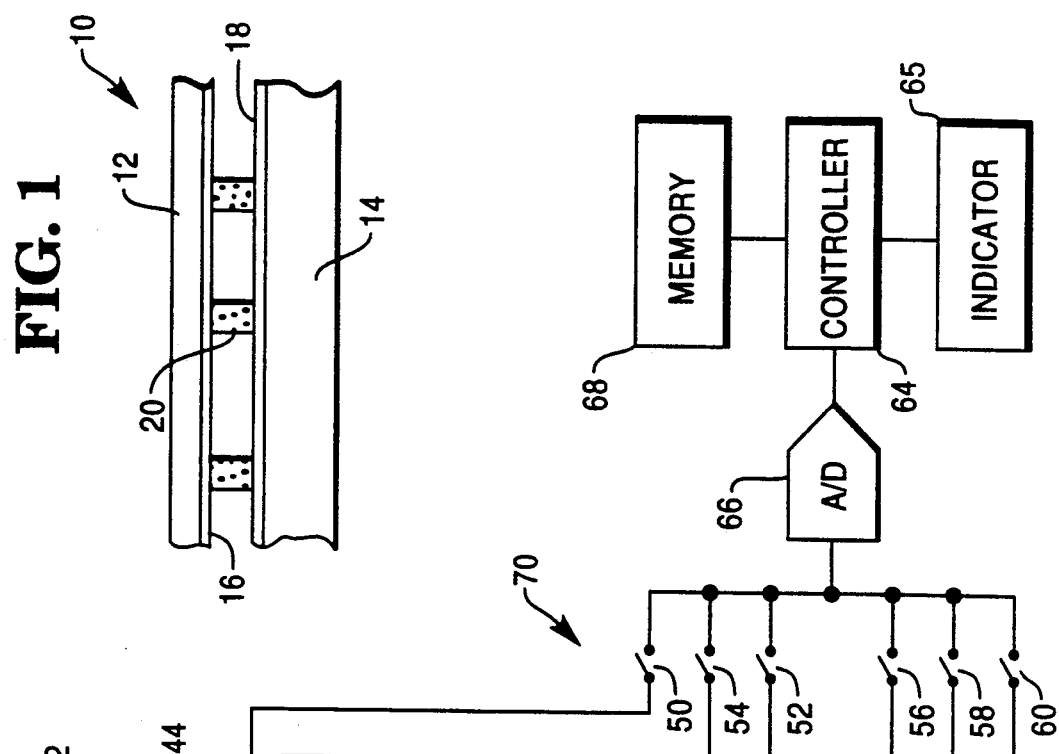
FIG. 1 is a cutaway view of a typical digitizer.

Turning now to FIG. 1, digitizer 10 includes two layers 12 and 14 which are placed one on top of the other with their upper and lower conductive layers 16 and 18 facing each other. Top or "dynamic" layer 12 is relatively thin and flexible and is typically made of polyester film. Bottom or "static" layer 14 is fairly rigid and is typically made of glass. Uniformly spaced dots 20 of insulating material keep layers 12 and 14 separated while no pressure is being applied to the dynamic layer 12. When pressure or "touch" is applied to dynamic layer 12, upper conductive layer 16 makes electrical contact with lower conductive layer 18. Digitizer 10 may be either opaque or transparent.

Figure 2:
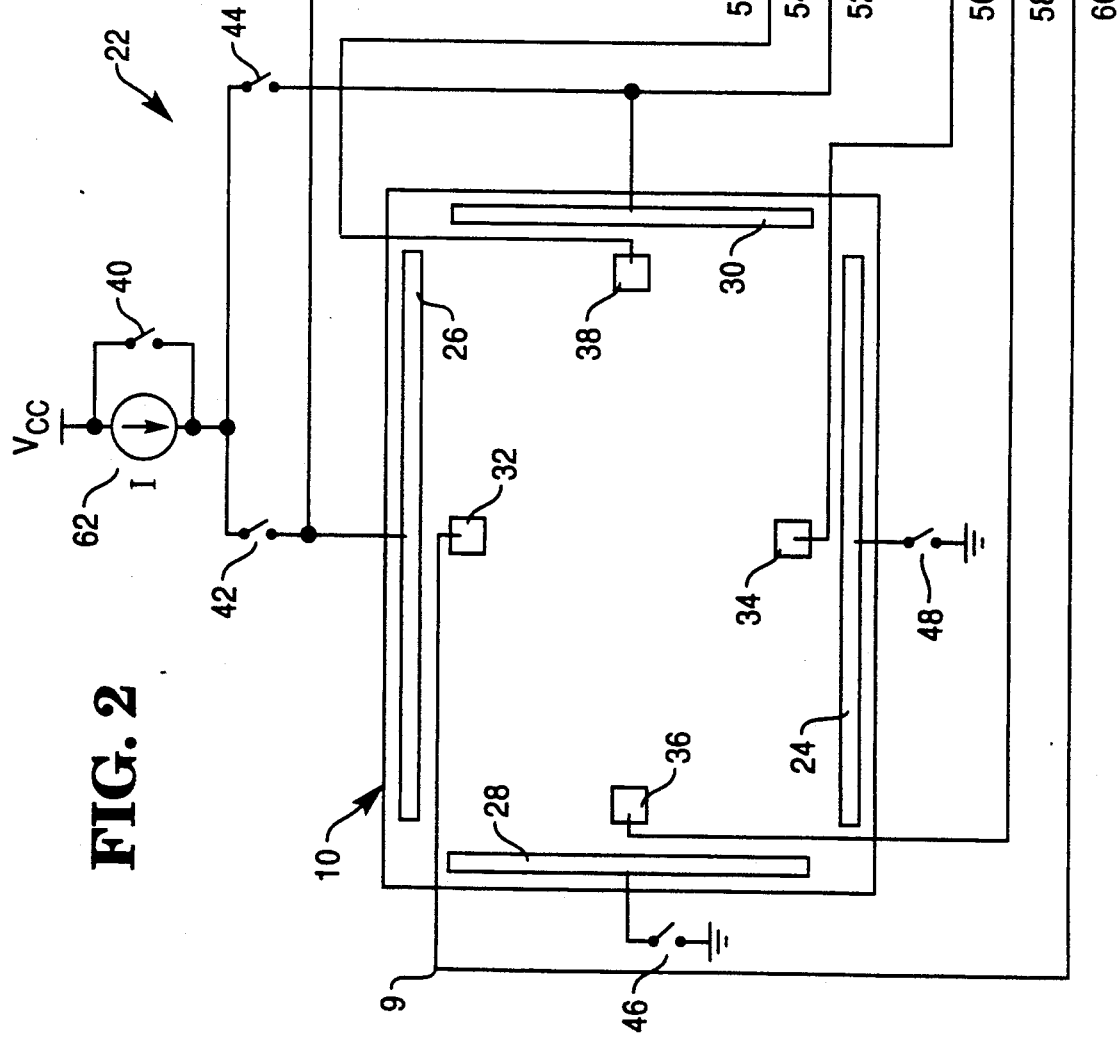
FIG. 2 is a schematic diagram of the apparatus of the present invention coupled to a digitizer.

Referring now to FIG. 2, digitizer 10 further includes electrodes 24-30 and test electrodes 32-38.

Digitizer electrodes 24 and 26 are located on top and bottom sides of lower conductive layer 18, while digitizer electrodes 28 and 30 are located on right and left sides of upper conductive layer 16.

Test electrodes 32 and 34 are applied to top and bottom sides of upper conductive layer 16, while test electrodes 36 and 38 are applied to right and left sides of lower conductive layer 18. Test electrodes 32-38 come with the digitizer at the request of the purchaser.

Associated control circuit 22 for digitizer includes test switches 40-60, constant current source 62, controller 64, analog-to-digital (A/D) converter 66, memory 68, and wiring harness 70 for connecting the parts of circuit 22. Test switches 40-60 are used to reconfigure digitizer 10 for different tests. Preferably, these are commercially available analog switches.

Constant current source 62 is required for taking various resistance measurements and is fed by voltage $V_{cc}$.

Controller 64 controls operation of test switches 40-60 and performs test routines.

Indicator 65 provides operators with information about the operability of digitizer 10 following the performance of the test routines. In the preferred embodiment, indicator 65 includes red and green (fail and pass) lights, which are mounted on the device containing write surface 22, and a video monitor associated with controller 64, although other indicators of operability are also envisioned.

A/D converter 66 is provided for reading various voltage levels for use by controller 64.

Memory 68 is required for storing various parameters used during testing. Preferably, memory 68 is a nonvolatile memory in order to maintain these parameters throughout the life of the product containing digitizer 10.

Normal digitizer operation begins with a touch on upper conductive layer 16. To measure the vertical position of a touch, for example, switches 40, 42, 48, and 52 are closed, while all other switches remain open. Lower conductive layer 18 assumes a uniform voltage gradient which varies directly with vertical position. Upper conductive surface 16 remains floating. When pressure is applied to digitizer 10, upper conductive layer 16 makes contact with lower conductive layer 18 and assumes the potential of lower conductive layer 18 at the point of pressure application. By measuring the potential of upper conductive layer 16 with A/D converter 66 via switch 52, controller 64 can determine vertical position.

Similarly, to measure horizontal position, switches 40, 44, 46, and 50 are closed, while all other switches remain open. A voltage gradient is created in the upper conductive layer 16 and picked up by the lower conductive layer 18 at the point of pressure application. A/D converter 66 reads the potential of the lower conductive layer 18 and controller 64 determines horizontal position.

Under the method of the present invention, there are four automated tests for detecting faults in digitizers. First, a sheet resistance test checks for changes in electrode-to-electrode resistance on each conductive surface. Second, a point reference test checks voltage readings at key test points on each layer. Third, a plate-to-plate resistance test checks resistance between conductive layers. Finally, a constant point test checks for false touch readings during the idle period between signatures. For optimum reliability, these tests should be performed as often as possible, usually during the idle period between signatures. For purposes of illustration, the four-wire resistive digitizer discussed above will be the subject of these tests.

Figure 3:
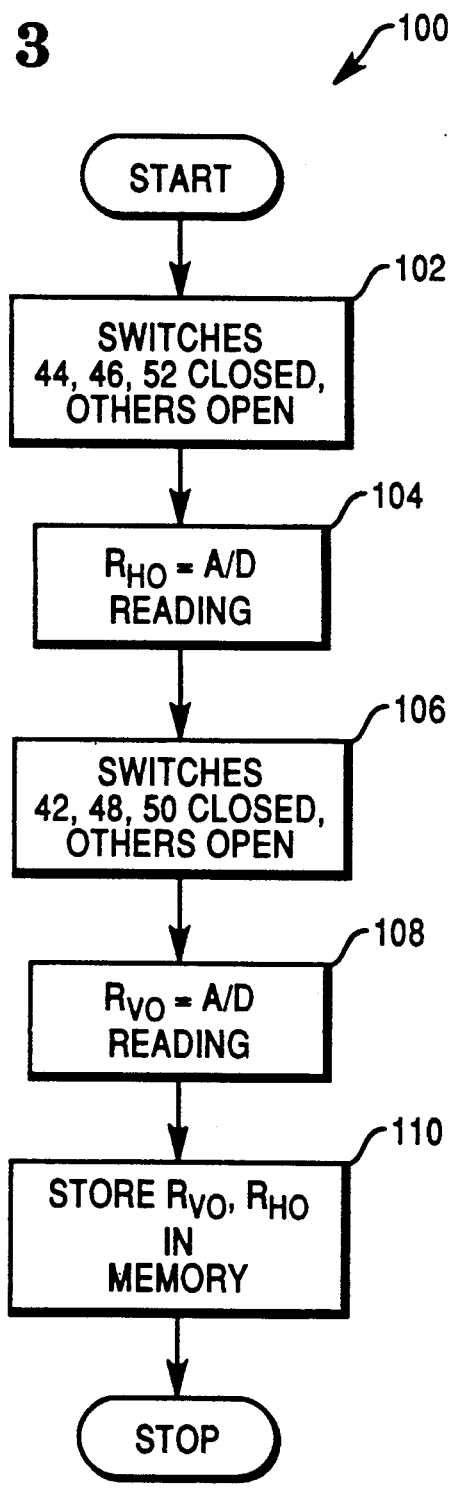
FIG. 3 is a flow diagram of a first part of the method of the present invention.
Figure 4:
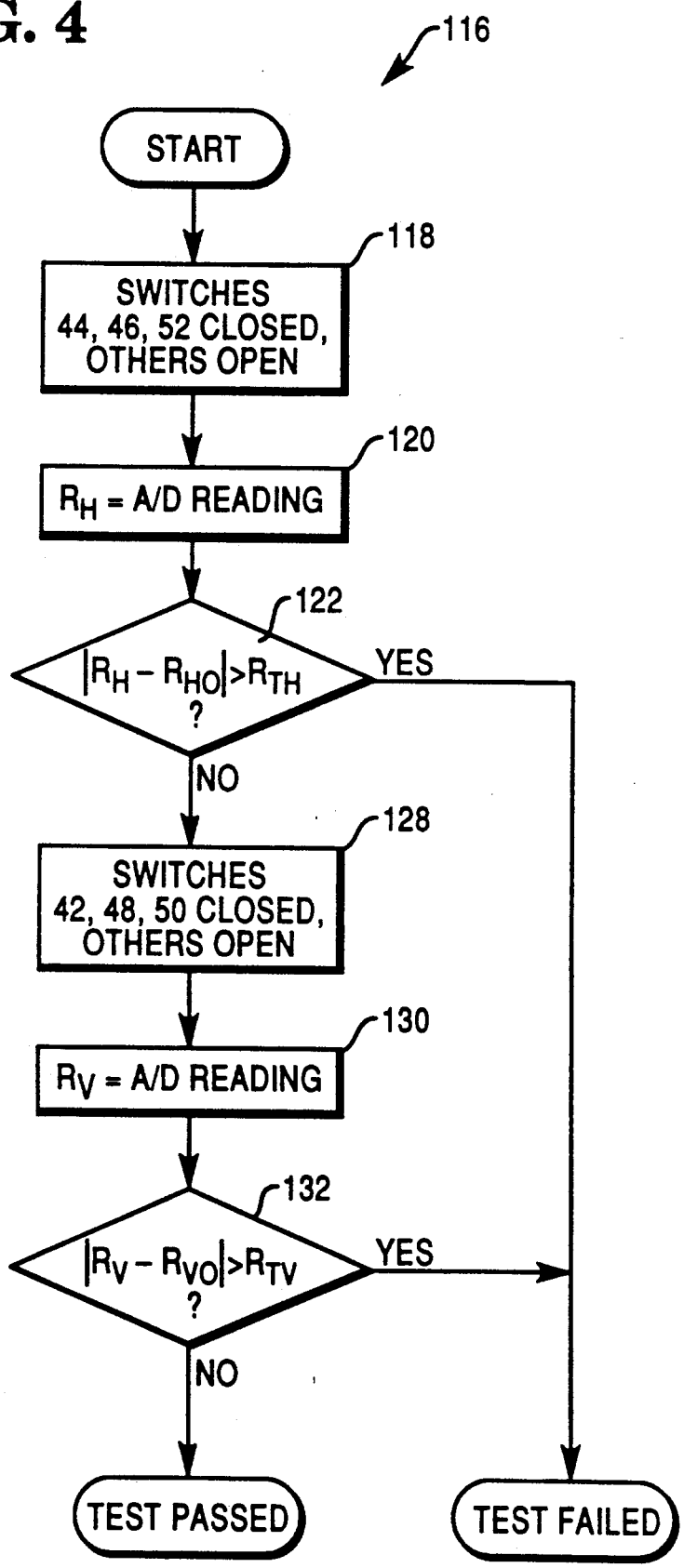
FIG. 4 is a flow diagram of a second part of the method of the present invention.

Referring now to FIGS. 3 and 4, the sheet resistance test is shown. Overall, resistance readings are taken from electrode to electrode on each layer. These readings are compared to previously stored values. If the new readings have significantly changed from the previously stored values, the digitizer has failed the sheet resistance test.

FIG. 3 shows the initialization procedure, which is preferably performed at the place of manufacture before the digitizer is exposed to wear. Alternatively, the initialization procedure may be performed after each sheet resistance test so as to sense any dramatic change in sheet resistance, as might be caused by a tear in the digitizer. Small changes are expected to occur over time and are ignored.

Initialization procedure 100 starts at block 102, where switches 44, 46, and 52 are closed and all other switches are left open. Current I from current source 62 flows through switch 44 to digitizer electrode 30, through lower conductive layer 18 to digitizer electrode 28, and through switch 46 to ground. A/D converter 66 is configured via switch 52 to read the voltage $V_{HO}$ required to drive current I through upper conductive layer 16.

In block 104, the initialization reading for upper conductive layer resistance $R_{HO}$ is stored. Since current I is constant, voltage $V_{HO}$ is treated as resistance $R_{HO}$. Therefore, current I need not be known.

In block 106, switches 42, 48, and 50 are closed and all others are open. Current I flows through switch 42 to digitizer electrode 32, through lower conductive layer 18 to digitizer electrode 34, and through switch 48 to ground. A/D converter 66 is configured via switch 50 to read the voltage $V_{VO}$ required to drive current I through lower conductive layer 18.

In block 108, the initialization reading for lower conductive layer resistance $R_{VO}$ is stored. Since current I is constant, voltage $V_{VO}$ is treated as resistance $R_{HO}$. Therefore, current I need not be known.

In block 110, initialization procedure 100 ends by storing both $R_{HO}$ and $R_{VO}$ in memory 68, which is preferably a non-volatile memory.

FIG. 4 shows sheet resistance test 116. In block 118, switches 44, 46, and 52 are closed and all other switches are left open. Current I from current source 62 flows through switch 44 to digitizer electrode 30, through upper conductive layer 16 to digitizer electrode 28, and through switch 46 to ground. A/D converter 66 is configured via switch 52 to read test voltage $V_H$ required to drive current I through upper conductive layer 16.

In block 120, the test reading for upper conductive layer resistance $R_H$ is stored. Since current I is constant, voltage $V_H$ is treated as resistance $R_H$.

In block 122, controller 64 compares the absolute value of the change in upper conductive layer resistance $|R_H - R_{HO}|$ with a predetermined upper conductive layer threshold value $R_{TH}$. If the absolute value is greater than threshold value $R_{TH}$, then digitizer 10 fails.

Threshold value $R_{TH}$ depends upon digitizer application. If digitizer 10 must be highly accurate, $R_{TH}$ should be as close to zero as possible. Some drift in $R_{TH}$ is expected and does not significantly impact digitizer performance. A typical value for $R_{TH}$ is about one percent of resistance $R_{HO}$.

If the comparison in block 122 is false, then test 116 continues to block 128, in which switches 42, 48, and 50 are closed and the other switches are open.

In block 130, the test reading for lower conductive layer resistance $R_V$ is stored. Since current I is constant, voltage $V_V$ is treated as resistance $R_V$.

In block 132, controller 64 compares the absolute value of the change in lower conductive layer resistance, $|IR_V - R_{VO}|$, with a predetermined lower conductive layer threshold value $R_{TV}$. Threshold value $R_{TV}$ is determined in a manner similar to threshold value $R_{TH}$ and has a typical value of one percent of resistance $R_{VO}$. If the absolute value is greater than threshold value $R_{TV}$, then digitizer 10 fails; otherwise, digitizer 10 passes.

Figure 5:
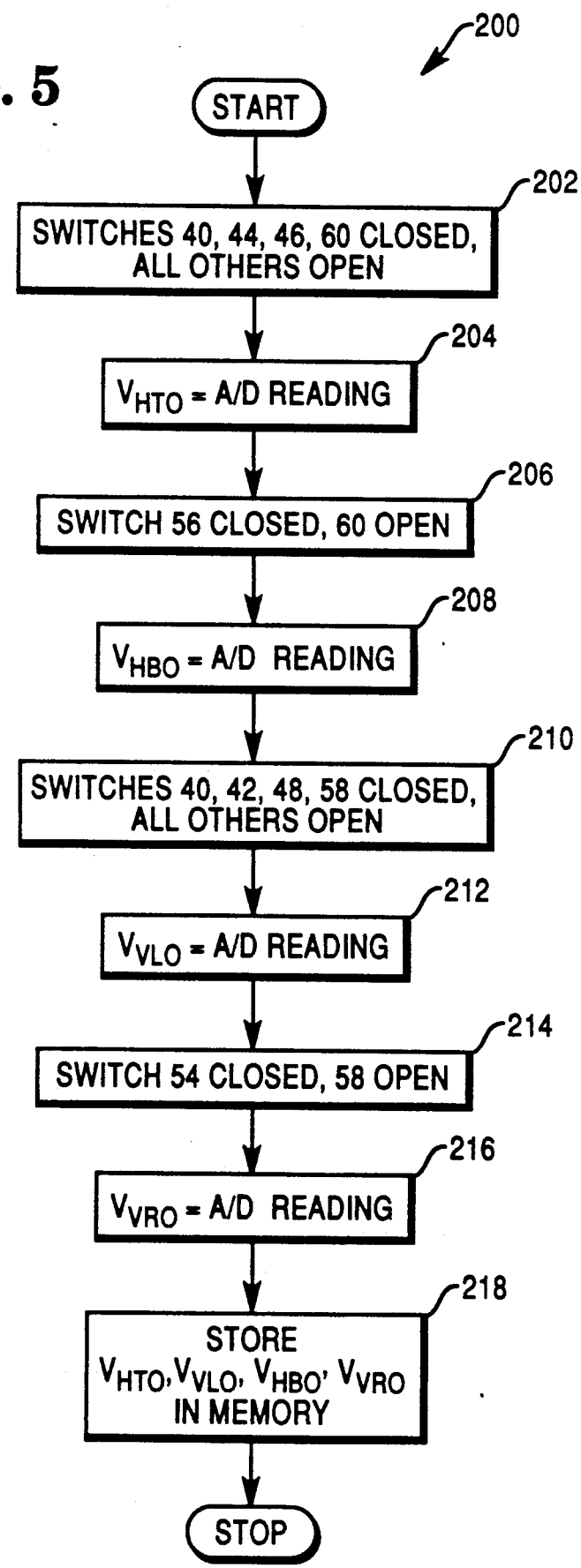
FIG. 5 is a flow diagram of a third part of the method of the present invention.
Figure 6:
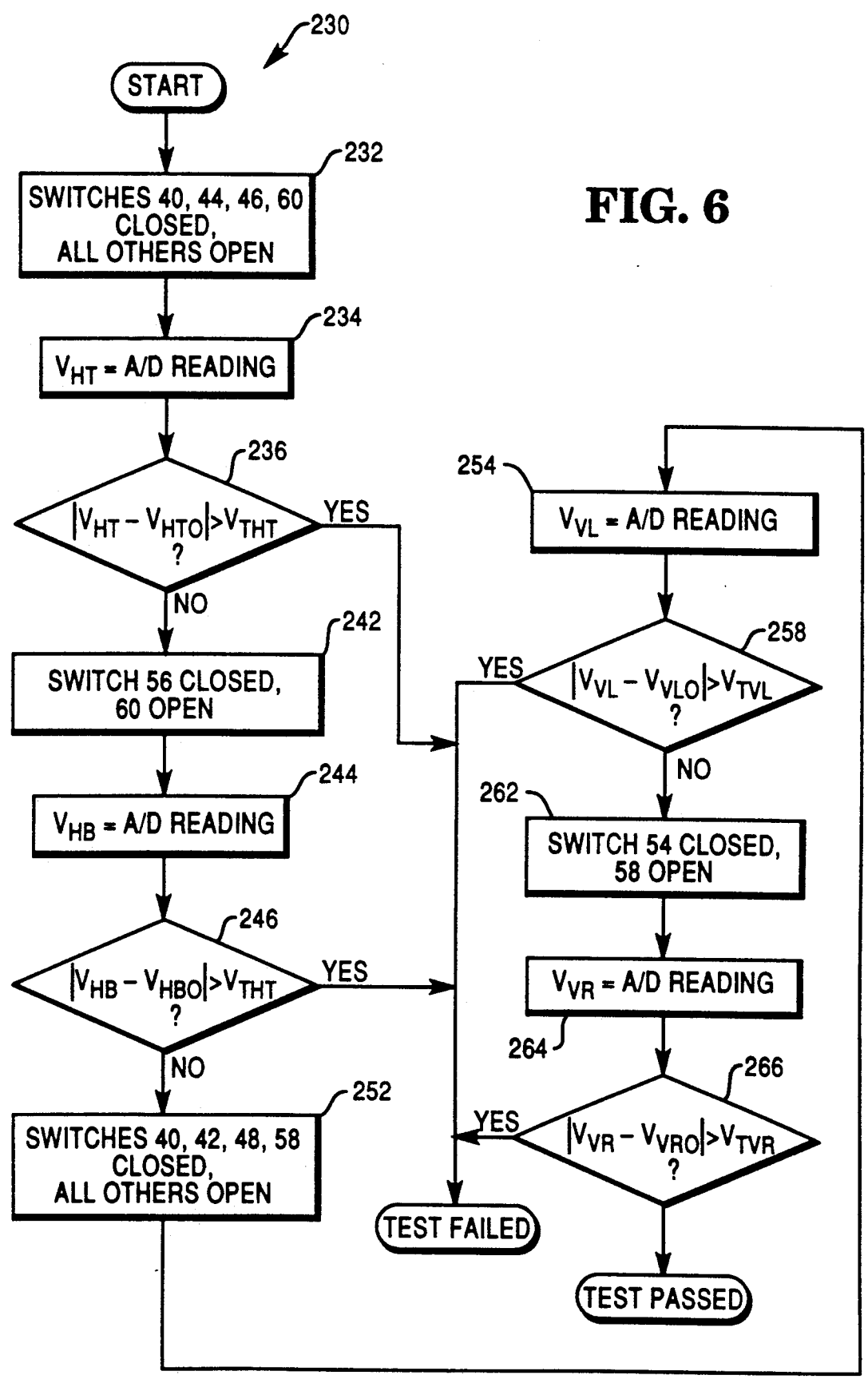
FIG. 6 is a flow diagram of a fourth part of the method of the present invention.

Referring now to FIGS. 5 and 6, the point reference test is shown. Overall, the point reference test detects nonuniformities in either conductive layer. Each conductive layer is energized in turn and voltage readings are taken from several permanently attached test points 32, 34, 36, and 38 strategically located on each layer. If these voltage readings deviate significantly from previously stored readings, then digitizer 10 fails the test.

FIG. 5 shows the initialization procedure 200, which is preferably performed at the place of manufacture before digitizer 10 is exposed to wear. Alternatively, the initialization procedure may be performed after each point reference test so as to sense any dramatic change in sheet resistance, as might be caused by a tear in digitizer 10. Small changes are expected to occur over time and are ignored.

In block 202, switches 40, 44, 46, and 60 are closed and all other switches are left open. Switch 40 applies voltage $V_{cc}$ to digitizer electrode 30 through switch 44 and switch 46 grounds digitizer electrode 28 to create a voltage gradient across upper conductive layer 16.

In block 204, the test reading for upper conductive layer voltage $V_{HTO}$ is stored, where voltage $V_{HTO}$ represents the voltage reading at test electrode 32.

In block 206, switch 56 is closed and switch 60 is opened, thereby connecting A/D converter 66 to test electrode 34.

In block 208, the test reading for upper conductive layer voltage $V_{HBO}$ is stored, where voltage $V_{HBO}$ represents the voltage reading at test electrode 34.

In block 210, switches 40, 42, 48, and 58 are closed and all other switches are left open. Switch applies voltage $V_{cc}$ to digitizer electrode 26 through switch 42 and switch 48 grounds digitizer electrode 24 to create a voltage gradient across lower conductive layer 18.

In block 212, the test reading for lower conductive layer voltage $V_{VLO}$ is stored, where voltage $V_{HTO}$ represents the voltage reading at test electrode 36.

In block 214, switch 54 is closed and switch 58 is opened, thereby connecting A/D converter 66 to test electrode 38.

In block 216, the test reading for lower conductive layer voltage $V_{VRO}$ is stored, where voltage $V_{VRO}$ represents the voltage reading at test electrode 38.

In block 218, initialization ends by storing voltages $V_{HTO}$, $V_{VLO}$, $V_{HBO}$, and $V_{VRO}$ in memory 68, which is preferably a non-volatile memory.

FIG. 6 shows point reference test 230. In block 232, switches 40, 44, 46, and 60 are closed and all other switches are left open. Switch 40 applies voltage $V_{cc}$ to digitizer electrode 30 through switch 44 and switch 46 grounds digitizer electrode 28 to create a voltage gradient across upper conductive layer 16.

In block 234, the test reading for upper conductive layer voltage VHT is stored, where voltage $V_{HT}$ represents the voltage reading at test electrode 32.

In block 236, controller 64 compares the absolute value of the change in upper conductive layer voltage, $|V_{HT} - R_{HTO}|$, with a predetermined upper conductive layer threshold value $V_{THT}$. If the absolute value is greater than threshold value $V_{THT}$, then the digitizer fails.

Threshold value $V_{THT}$ depends upon digitizer application. If digitizer 10 must be highly accurate, $V_{THT}$ should be as close to zero as possible. Some drift in $V_{THT}$ is expected and does not significantly impact digitizer performance. A typical value for $V_{THT}$ is about one percent of voltage $V_{THO}$.

If the comparison in block 236 is false, then test 230 continues to block 242, in which switch 56 is closed and 60 is open, connecting the input of A/D converter 66 to test electrode 34. All other switches are open.

In block 244, the test reading for lower conductive layer voltage $V_{HB}$ is stored.

In block 246, controller 64 compares the absolute value of the change in lower conductive layer voltage, $|V_{HB} - v_{HBO}|$, with a predetermined lower conductive layer threshold value $V_{THB}$. Threshold value $V_{THB}$ is determined in a manner similar to threshold value $V_{THT}$ and has a typical value of one percent of resistance $V_{HBO}$. If the absolute value is greater than threshold value $V_{THB}$, then the digitizer fails; otherwise, the test continues.

In block 252, switches 40, 42, 48, and 58 are closed and all other switches are left open. Switch 40 applies voltage $V_{cc}$ to digitizer electrode 26 through switch 42, and switch 48 grounds digitizer electrode 24 to create a voltage gradient across lower conductive layer 18.

In block 254, the test reading for lower conductive layer voltage $V_{VL}$ is stored, where voltage $V_{VL}$ represents the voltage reading at test electrode 36.

In block 258, controller 64 compares the absolute value of the change in lower conductive layer voltage, $|V_{VL}-V_{VLO}|$, with a predetermined lower conductive layer threshold value $V_{TVL}$. If the absolute value is greater than threshold value $V_{TVL}$, then the digitizer fails.

Threshold value $V_{TVL}$ depends upon digitizer application. If digitizer 10 must be highly accurate, $V_{TVL}$ should be as close to zero as possible. Some drift in $V_{TVL}$ is expected and does not significantly impact digitizer performance. A typical value for $V_{TVL}$ is about one percent of voltage $V_{VLO}$.

If the comparison in block 258 is false, then test 230 continues to block 262, in which switch 54 is closed and 58 is open, connecting the input of A/D converter 66 to test electrode 38. All other switches are open.

In block 264, the test reading for lower conductive layer voltage $V_{VR}$ is stored.

In block 266, controller 64 compares the absolute value of the change in lower conductive layer voltage, $|V_{VR}-V_{VRO}|$, with a predetermined lower conductive layer threshold value $V_{TVR}$. Threshold value $V_{TVR}$ is determined in a manner similar to threshold value $V_{TVR}$ and has a typical value of one percent of resistance $V_{VRO}$. If the absolute value is greater than threshold value $V_{TVR}$, then digitizer 10 fails; otherwise, digitizer 10 passes.

Figure 7:
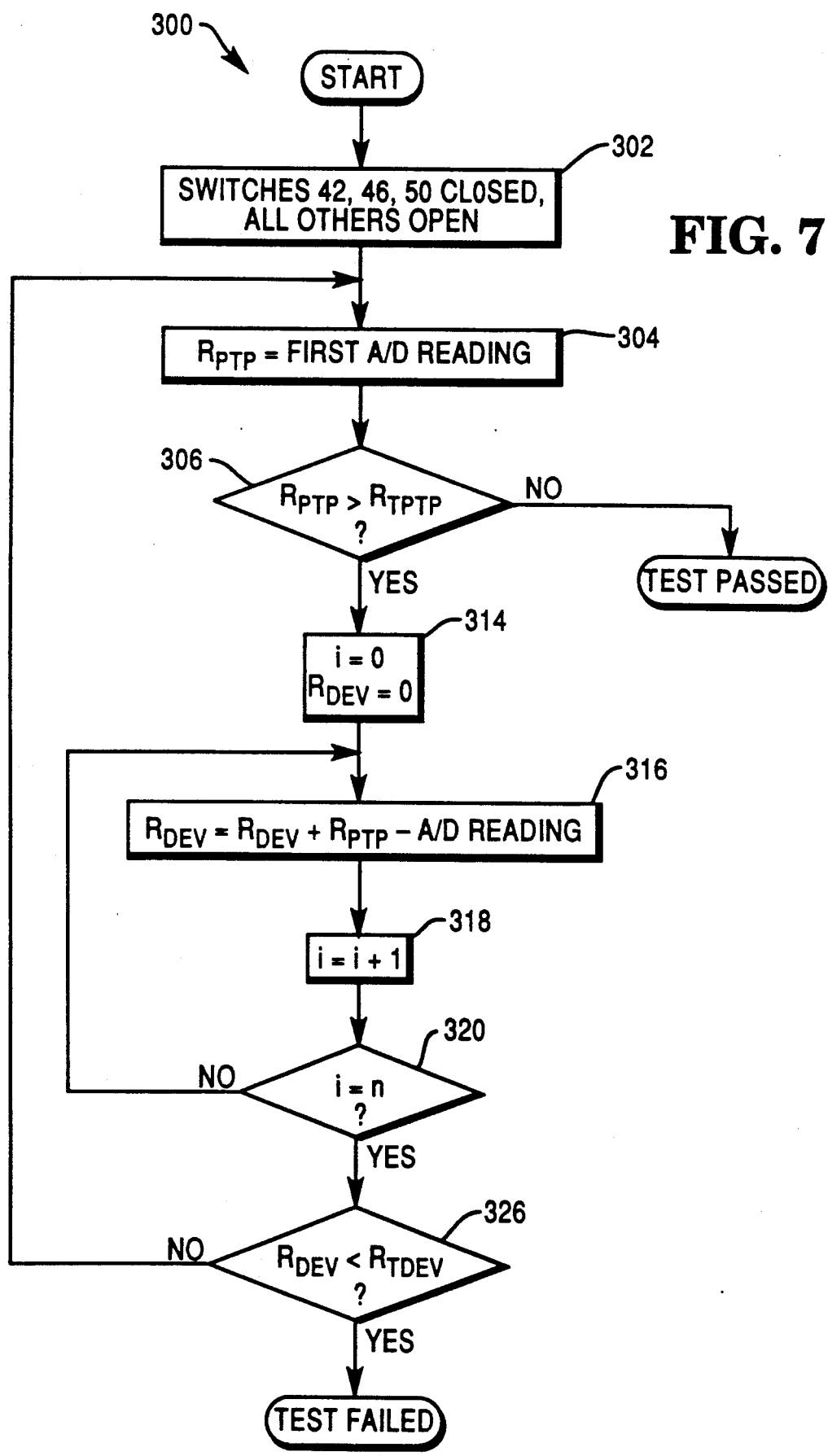
FIG. 7 is a flow diagram of a fifth part of the method of the present invention.

Referring now to FIG. 7, the plate-to-plate resistance test is shown. Overall, the plate-to-plate resistance test detects a short circuit between conductive layers. The plate-to-plate resistance is measured and compared to a predetermined threshold value. If the plate-to-plate resistance is greater than or equal to the threshold, then the digitizer passes the test. On the other hand, if the plate-to-plate resistance is less than the threshold, then a determination is made as to whether the digitizer was is in use during the reading. To determine whether digitizer 10 was in use, many plate-to-plate resistance readings are taken and compared. If they are significantly close to the initial reading, digitizer 10 fails the test. If not, then the entire test is repeated until digitizer 10 either passes or fails the test.

Plate-to-plate resistance test 300 begins in block 302. Switches 42, 46, and 50 are closed and all others are open, thereby applying current I from constant current source 62 to digitizer electrode 26, and grounding digitizer electrode 28. A/D converter 66 monitors the voltage required to drive current I into digitizer electrode 26.

In block 304, resistance $R_{PTP}$ between electrodes 26 and 28 is stored as a voltage, since the voltage is directly proportional to resistance $R_{PTP}$.

In block 306, controller 64 compares resistance $R_{PTP}$ to threshold resistance $R_{TPTP}$. If resistance $R_{PTP}$ is greater than threshold resistance $R_{TPTP}$, then digitizer 10 passes; otherwise, test 300 continues.

In block 314, count variable i and deviation sum $R_{DEV}$ are set equal to zero.

In block 316, deviation sum is set equal to the previous deviation sum plus plate-to-plate resistance $R_{PTP}$ minus the next resistance reading.

In block 318, counter variable i is incremented by one.

In block 320, controller 64 compares counter variable i with a predetermined number n. Preferably, number n is equal to one hundred, although if electrical noise is present in the digitizer, then a higher number is preferred. If count variable i is not equal to number n, then test 300 returns to block 316; otherwise, test 300 continues.

At this point, resistance sum $R_{DEV}$ is equal to the sum of all the deviations of n consecutive resistance readings from the initial $R_{PTP}$ reading. If resistance sum is close to zero, then resistance $R_{PTP}$ is fairly constant, and a touch is likely not in progress.

In block 326, controller 64 compares resistance sum $R_{PTP}$ to threshold cutoff $R_{TDEV}$, which is preferably two percent of the full scale of A/D converter 66. Threshold value $R_{TPTP}$ should be greater than voltage $V_{cc}$ minus any voltage drop due to saturated constant current source 62 and any DC error in A/D converter 66. Typically, threshold value $R_{TPTP}$ (in terms of voltage) might be about $V_{cc}$ minus one volt. If resistance sum $R_{DEV}$ is less than threshold cutoff $R_{TDEV}$, then digitizer 10 fails test 300; otherwise, test 300 continues at block 304 until digitizer 10 either passes or fails test 300.

Figure 8:
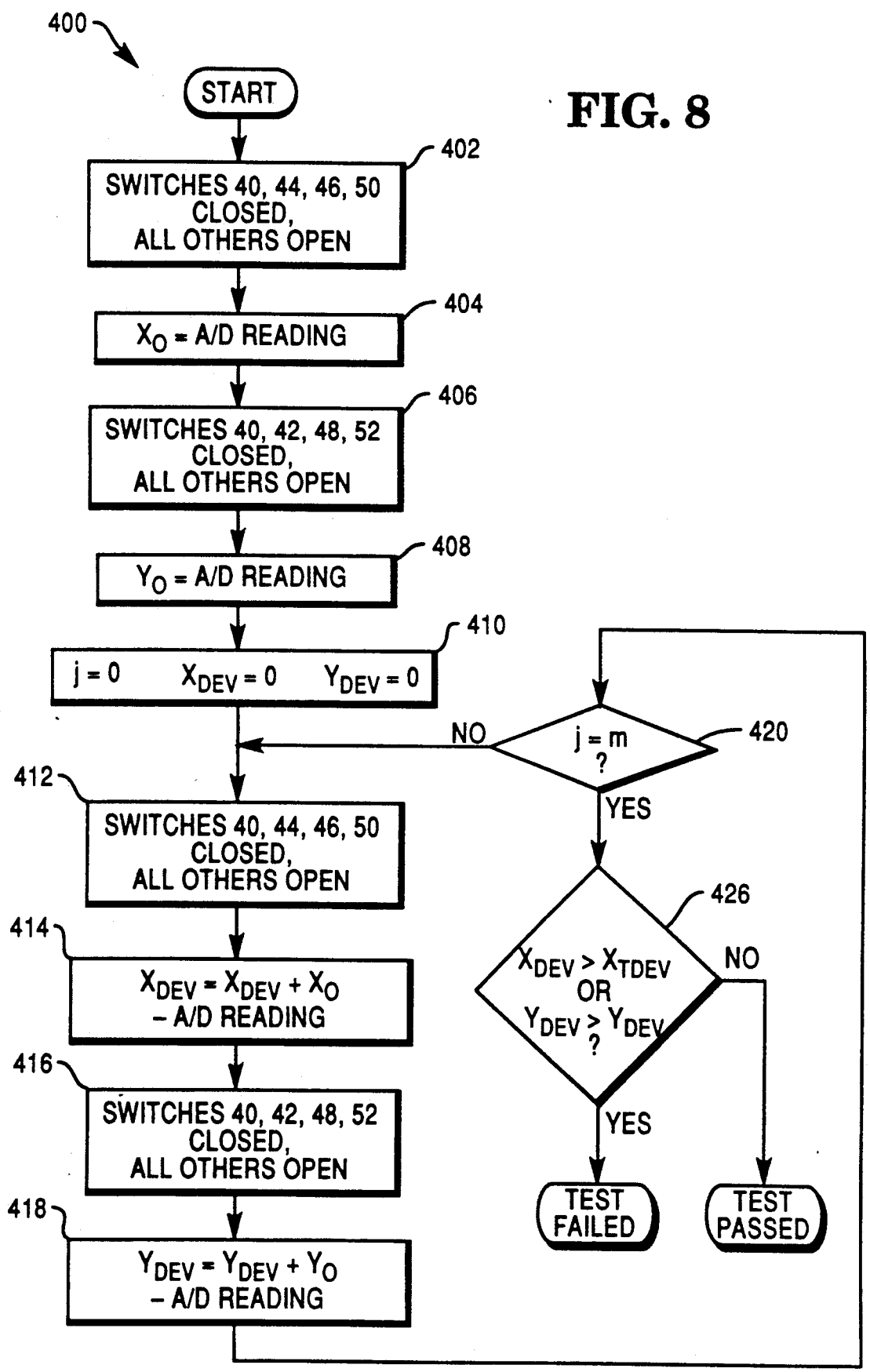
FIG. 8 is a flow diagram of an sixth part of the method of the present invention.

Referring now to FIG. 8, constant point test 400 is shown. Constant point test 400 is another way to detect a short circuit between conductive layers 16 and 18. This test assumes that the short circuit is bad enough to cause a false touch reading when there is actually no touch being applied. It differs from the plate-to-plate resistance test in that it does not require any hardware in addition to that required for basic four-wire digitizer operation.

Overall, initial horizontal and vertical touch readings are taken. In order to ensure that digitizer 10 is not in use during the test, these initial readings are compared to several subsequent readings. If subsequent readings do not deviate significantly from initial readings, then digitizer 10 fails.

In block 402, switches 40, 44, 46, and 50 are closed and all other switches are open, thereby energizing digitizer electrodes 28 and 30 for a horizontal touch reading.

In block 404, initial horizontal reading $X_0$ is set equal to the current A/D reading. Initial horizontal reading $X_0$ is thus proportional to the horizontal position of any touch or short circuit, should there be one.

In block 406, switches 40, 42, 48, and 52 are closed and all others are open, thereby energizing digitizer electrodes 24 and 26 for a vertical touch reading.

In block 408, initial vertical reading $Y_0$ is set equal to the current A/D converter reading. Initial vertical reading $Y_0$ is thus proportional to the vertical position of any touch or short circuit, should there be one.

In block 410, count variable j and deviation sums $X_{DEV}$ and $Y_{DEV}$ are set equal to zero. Deviation sums $X_{DEV}$ and $Y_{DEV}$ are equal to the sum of all deviations of subsequent positional A/D converter readings from the initial horizontal and vertical readings $X_0$ and $Y_0$. If deviation sums $X_{DEV}$ and $Y_{DEV}$ are close to zero, then a touch is likely not in progress.

In block 412, digitizer 10 is energized as in block 402.

In block 414, deviation sum $X_{DEV}$ is set to the previous value of $X_{DEV}$ plus initial horizontal reading $X_0$ minus the current A/D converter reading.

In block 416, digitizer 10 is energized as in block 406.

In block 418, deviation sum $Y_{DEV}$ is set to the previous value of $Y_{DEV}$ plus initial vertical reading $Y_0$ minus the current A/D converter reading.

In block 420, controller 64 compares counter variable j with a predetermined number m. Preferably, counter variable m is equal to one hundred. If j is not equal to m, then test 400 goes back to block 412. If j is equal to m, then test 400 continues. If electrical noise in digitizer 10 is significant, then number m should be greater than one hundred.

In block 426, controller 64 compares deviation sum $X_{DEV}$ with threshold value $X_{TDEV}$ and deviation sum $Y_{DEV}$ with threshold value $Y_{TDEV}$. If $X_{DEV}$ is greater than $X_{TDEV}$ or $Y_{DEV}$ is greater than $Y_{TDEV}$ then digitizer 10 fails; otherwise, digitizer 10 passes. A realistic value for threshold values $X_{TDEV}$ and $Y_{TDEV}$ is two percent of the full scale of A/D converter 66.

Although a four-wire digitizer 10 has been shown and discussed, the apparatus and method of the present invention can be easily adapted by one skilled in the art to other types of commercially available digitizers, such as five-wire digitizers, or a four-wire in which only two of the digitizer electrodes are used.

Figure 9:
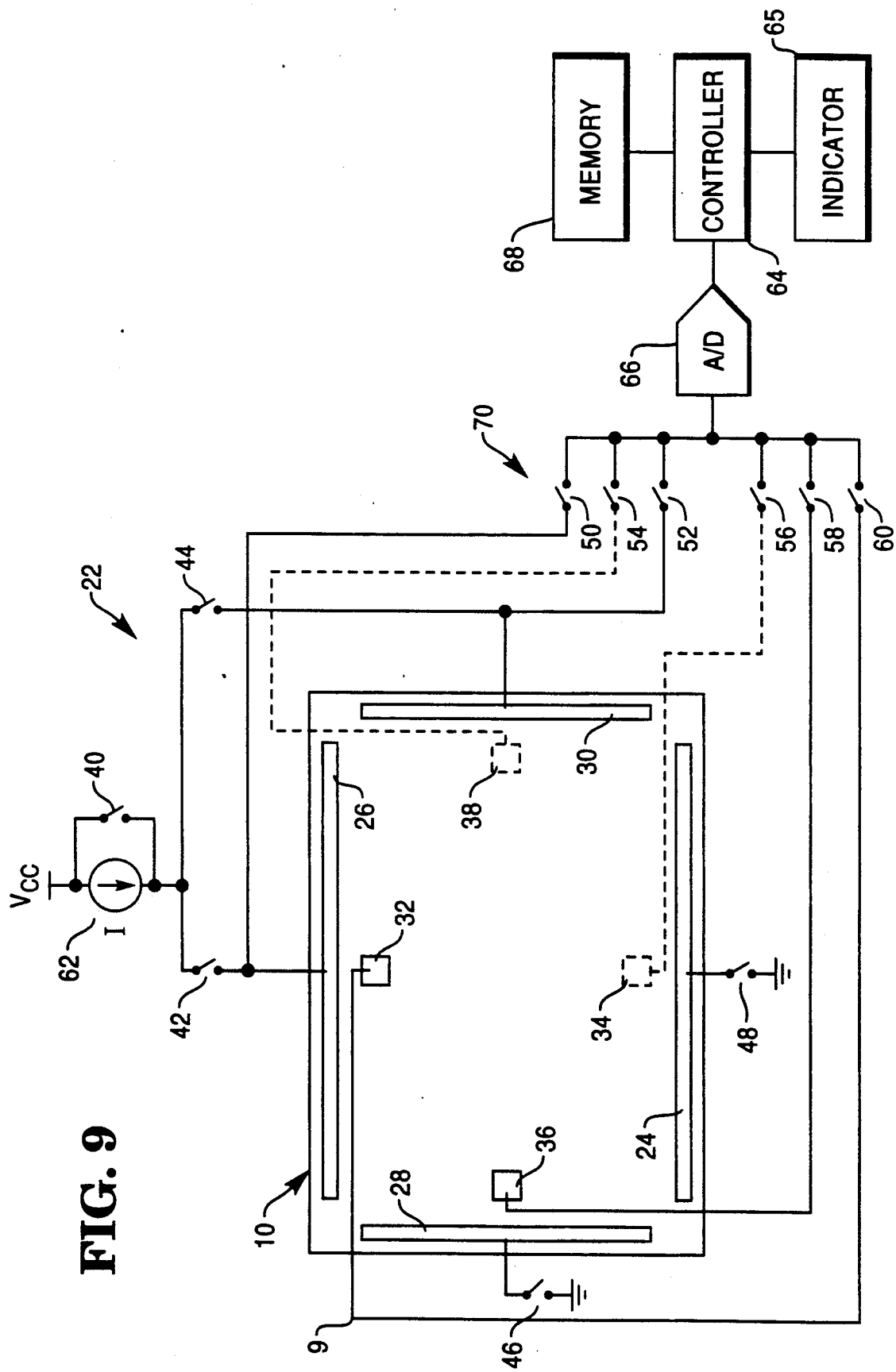
FIG. 9 is a schematic diagram of the apparatus of the present invention coupled to a two-wire digitizer.

Thus, referring to FIG. 9, automatic fault detection apparatus 22 of FIG. 2 is configured for only two of the digitizer electrodes of four-wire digitizer 10. While this embodiment is less optimal for accuracy, it may be advantageous for cost savings, Apparatus 22 is the same in FIG. 9 as in FIG. 2, except that test electrodes 34 and 38 are not used. Switches 54 and 56 are also not in use.

Referring now to FIG. 10, point reference test initialization procedure 460 using apparatus 22 is shown. The only test that needs modification for this apparatus is the point reference test. Initialization procedure 460 is similar to procedure 200, except that blocks 206, 208, 214, and 216 are not performed. Similarly, point reference test 470, shown in FIG. 11, is similar to test 230, except that blocks 242, 244, 246, 262, 264, and 266 are not performed.

Although the invention has been described with particular reference to certain preferred embodiments thereof, variations and modifications of the present invention can be effected within the spirit and scope of the following claims.

What is claimed is:

1. An apparatus for detecting faults in a digitizer, the digitizer having a plurality of operative electrodes, comprising:

source means for energizing the digitizer including a constant direct current source, a constant direct voltage source, and a first switch means for selectively coupling either the constant current source or the constant voltage source to the digitizer;

an analog-to-digital converter coupled to the digitizer and to the source means;

a controller coupled to the output of the analog-to-digital converter for performing fault detection routines;

means coupled to the controller for indicating information about the operability of the digitizer;

a second switch means for selectively connecting the source means and the analog-to-digital converter to the digitizer, the first and second switch means including analog switches controlled by the controller;

a non-volatile memory coupled to the controller;

a plurality of test electrodes within the digitizer coupled to the analog-to-digital converter; and a wiring harness for connecting the analog-to-digital converter and the source means to the digitizer.

2. A method for detecting a change in resistance across one conductive layer of a digitizer having two normally-separated conductive layers comprising the steps of:

measuring a first resistance value between first and second end electrodes of the one conductive layer while the one conductive layer is separated from the other conductive layer;

storing the first resistance value;

measuring a second resistance value between the first and second end electrodes of the one conductive layer while the one conductive layer is separated from the other conductive layer;

comparing the second resistance value with the previously stored first resistance value;

indicating a pass indication if the difference between the second resistance value and the previously stored first resistance value is less than a predetermined number; and indicating a fail indication if the difference between the second resistance value and the previously stored first resistance value is greater than the predetermined number.

3. The method as recited in claim 2, wherein the steps of measuring comprise the substeps of:

coupling a constant current source to the first end electrode on the one conductive layer;

coupling a ground to the second end electrode on the one conductive layer;

coupling a controller to the first end electrode; and measuring a voltage between the first and second end electrodes, the resistance values each being proportional to the voltage.

4. The method as recited in claim 3, wherein the step of coupling a constant current source comprises the substep of closing a first analog switch in response to a signal from the controller.

5. The method as recited in claim 3, wherein the step of coupling a ground comprises the substep of closing a second analog switch in response to a signal from the controller.

6. The method as recited in claim 3, wherein the step of coupling a controller comprises the substep of closing a third analog switch in response to a signal from the controller.

7. A method for detecting a change in uniformity of resistance across one conductive layer of a digitizer having two normally-separated conductive layers comprising the steps of:

measuring a first voltage value at a test electrode on the one conductive layer between first and second end electrodes of the one conductive layer while the one conductive layer is separated from the other conductive layer;

storing the first voltage value;

measuring a second voltage value at the test electrode on the one conductive layer while the one conductive layer is separated from the other conductive layer;

comparing the second voltage value with the previously stored first voltage value;

indicating a pass indication if the difference between the second voltage value and the previously stored first voltage value is less than a predetermined number; and indicating a fail indication if the difference between the second voltage value and the previously stored first voltage value is greater than the predetermined number.

8. The method as recited in claim 7, wherein the steps of measuring comprise the substeps of:

coupling a constant voltage source to the first end electrode on the one conductive layer;
coupling a ground to the second end electrode on the one conductive layer; and
coupling a controller to the test electrode on the one conductive layer.

9. The method as recited in claim 8, wherein the step of coupling a constant voltage source comprises the substep of closing a first analog switch in response to a signal from the controller.

10. The method as recited in claim 8, wherein the step of coupling a ground comprises the substep of closing a second analog switch in response to a signal from the controller.

11. The method as recited in claim 10, wherein the step of coupling a controller comprises the substep of closing a third analog switch in response to a signal from the controller.

12. A method for detecting a change in separation resistance between first and second conductive layers within a digitizer comprising the steps of:
measuring a first resistance value between an end electrode on the first conductive layer and an end electrode on the second conductive layer of the digitizer while the first conductive layer is separated from the second conductive layer;
storing the first resistance value;
measuring a second resistance value between the end electrode of the first conductive layer and the end electrode of the second conductive layer of the digitizer;
comparing the second resistance value with the previously stored first resistance value; and
indicating a pass indication if the second resistance value is less than the previously stored first resistance value.

13. The method as recited in claim 12, further comprising the steps of:
measuring a predetermined number of additional resistance values between the end electrode of the first conductive layer and the end electrode of the second conductive layer;
summing the deviations of the additional resistance values from the second resistance value;
comparing the sum of the deviations to a predetermined threshold deviation;
indicating a fail indication if the sum of the deviations is less than the predetermined threshold deviation; and
repeating the method if the sum of the deviations is greater than the predetermined threshold deviation.

14. The method as recited in claim 12, wherein the steps of measuring each resistance value comprises the substeps of:
coupling a constant current source to the end electrode on the first conductive layer;
coupling a ground to the end electrode on the second conductive layer;
coupling a controller to the end electrode on the first conductive layer; and
measuring a voltage at the end electrode on the first conductive layer, the first and second resistances each being proportional to the voltage.

15. The method as recited in claim 14, wherein the step of coupling a constant current source comprises the substep of closing a first analog switch in response to a signal from the controller.

16. The method as recited in claim 14, wherein the step of coupling a ground comprises the substep of closing a second analog switch in response to a signal from the controller.

17. The method as recited in claim 14, wherein the step of coupling a controller comprises the substep of closing a third analog switch in response to a signal from the controller.

18. A method for detecting faults within a digitizer comprising the steps of:
measuring a voltage value between first and second conductive layers;
measuring a predetermined number of additional voltage values between the first and second conductive layers;
summing the deviations of the additional voltage values from the one voltage value;
comparing the sum of the deviations with a predetermined threshold deviation;
indicating a pass indication if the sum of the deviations is less than the predetermined threshold; and
indicating a fail indication if the sum of the deviations is greater than the predetermined threshold.

19. The method as recited in claim 18, wherein the step of measuring comprises the substeps of:
coupling a constant voltage source to a first electrode on the first conductive layer;
coupling a ground to a second electrode on the first conductive layer;
coupling a controller to a third electrode on the second conductive layer; and
measuring a voltage at the third electrode.

20. The method as recited in claim 18, wherein the step of coupling a constant voltage source comprises the substep of closing a first analog switch in response to a signal from the controller.

21. The method as recited in claim 18, wherein the step of coupling a ground comprises the substep of closing a second analog switch in response to a signal from the controller.

22. The method as recited in claim 18, wherein the step of coupling a controller comprises the substep of closing a third analog switch in response to a signal from the controller.

23. An apparatus for detecting faults in a digitizer having an operative electrode comprising:
source means for energizing the digitizer;
an analog-to-digital converter coupled to the digitizer and to the source means;
a controller coupled to the output of the analog-to-digital converter for performing fault detection routines;
switch means for selectively connecting the source means and the analog-to-digital converter to the digitizer; and
a test electrode within the digitizer coupled to the analog-to-digital converter.

24. A method for detecting faults within a digitizer comprising the steps of:
measuring a resistance value between a first conductive layer and a second conductive layer of the digitizer;
comparing the resistance value with a previously stored threshold resistance value;
indicating a pass indication if the resistance value is less than the previously stored resistance value;

measuring a predetermined number of additional resistance values between the first and second conductive layers;

summing the deviations of the additional resistance values from the one resistance value;

comparing the sum of the deviations to a predetermined threshold deviation;

indicating a fail indication if the sum of the deviations is less than the predetermined threshold deviation; and repeating the method if the sum of the deviations is greater than the predetermined threshold deviation.

* * * * *